US009996299B2

(12) United States Patent
Yang et al.

(10) Patent No.: US 9,996,299 B2
(45) Date of Patent: Jun. 12, 2018

(54) MEMORY HEALTH MONITORING

(71) Applicant: Western Digital Technologies, Inc., San Jose, CA (US)

(72) Inventors: Nian Niles Yang, Mountain View, CA (US); Idan Alrod, Herzliya (IL)

(73) Assignee: WESTERN DIGITAL TECHNOLOGIES, INC, San Jose, CA (US)

( * ) Notice: Subject to any disclaimer, the term of this patent is extended or adjusted under 35 U.S.C. 154(b) by 229 days.

(21) Appl. No.: 14/924,615

(22) Filed: Oct. 27, 2015

(65) Prior Publication Data

US 2016/0378400 A1 Dec. 29, 2016

Related U.S. Application Data

(60) Provisional application No. 62/184,676, filed on Jun. 25, 2015.

(51) Int. Cl.
*G06F 12/00* (2006.01)
*G06F 3/06* (2006.01)
*G11C 7/10* (2006.01)
*G11C 16/34* (2006.01)

(52) U.S. Cl.
CPC .......... *G06F 3/0653* (2013.01); *G06F 3/0616* (2013.01); *G06F 3/0679* (2013.01); *G11C 7/1006* (2013.01); *G11C 16/3495* (2013.01); *G11C 2211/5647* (2013.01)

(58) Field of Classification Search
CPC .... G06F 3/0653; G06F 3/0616; G06F 3/0679; G11C 7/1006; G11C 16/3495; G11C 2211/5647
See application file for complete search history.

(56) References Cited

U.S. PATENT DOCUMENTS

| 7,743,290 B2 | 6/2010 | Furuhjelm et al. |
| 8,296,545 B2 | 10/2012 | Estakhri et al. |
| 2004/0255090 A1 | 12/2004 | Guterman et al. |

(Continued)

OTHER PUBLICATIONS

PCT Application No. PCT/US2016/036847, International Search Report and the Written Opinion of the International Searching Authority, dated Sep. 19, 2016, 10 pages.

(Continued)

*Primary Examiner* — Hiep Nguyen
(74) *Attorney, Agent, or Firm* — Patterson & Sheridan, LLP; Steven Versteeg

(57) ABSTRACT

A data storage device may be configured to write first data to a first set of storage elements of a non-volatile memory and to write second data to a second set of storage elements of the non-volatile memory. The first data may be processed by a data shaping operation, and the second data may not be processed by the data shaping operation. The data storage device may be further configured to read a representation of the second data from the second set of storage cells and to determine a block health metric of a portion of the non-volatile memory based on the representation of the second data. The portion may include the first set of storage elements and the second set of storage elements. As an illustrative, non-limiting example, the first portion may be a first block of the non-volatile memory.

19 Claims, 5 Drawing Sheets

(56) References Cited

U.S. PATENT DOCUMENTS

| | | | | |
|---|---|---|---|---|
| 2012/0005409 A1* | 1/2012 | Yang | ............... | G06F 12/0246 |
| | | | | 711/103 |
| 2012/0023387 A1* | 1/2012 | Wang | ............... | G06F 11/1048 |
| | | | | 714/773 |
| 2013/0054876 A1 | 2/2013 | Varanasi | | |
| 2014/0157086 A1* | 6/2014 | Sharon | ............... | G06F 11/1012 |
| | | | | 714/773 |
| 2015/0324148 A1* | 11/2015 | Achtenberg | ........ | G06F 11/1012 |
| | | | | 711/103 |

OTHER PUBLICATIONS

Khurana, B. et al., "Adaptive Data Shaping in Nonvolatile Memory", U.S. Appl. No. 14/618,317, filed Feb. 10, 2015, 46 pages.
International Preliminary Report on Patentability dated Jan. 4, 2018 for PCT/US2016/036847.

* cited by examiner

MEMORY HEALTH MONITORING

CROSS-REFERENCE TO RELATED APPLICATIONS

The present application claims benefit of U.S. Provisional Patent Application No. 62/184,676, filed Jun. 25, 2015, which is incorporated by reference herein in its entirety.

FIELD OF THE DISCLOSURE

The present disclosure is generally related to memory health monitoring.

BACKGROUND

Data storage devices can store shaped data to blocks of a memory to reduce wear on the blocks. For example, a data shaping operation may generate shaped data that has a larger number of bits having a first value (e.g., a logical one value) than bits having a second value (e.g., a logical zero value). Storing bits that have a logical one value to a block of the memory may reduce wear to the block as compared to storing bits that have a logical zero value. During a lifetime of the data storage device, programming (e.g., writing) data to and erasing data at the memory degrades a health of the memory. Thus, a health of a memory block may be based on a number of program-erase (P/E) cycles at the memory block. Additionally, a health of the memory block may be indicated by a number of bit errors in data stored at the memory block. For example, as wear increases, storage elements may fail, causing bit errors in stored data. Thus, a block health metric for a memory block may be determined based on a bit error rate (e.g., a fail bit count (FBC)) of stored data and a number of P/E cycles.

However, failure of some storage elements may not be noticeable unless a particular value (e.g., a logical one value) is stored in the storage elements. For example, a storage element may be able to store sufficient charge to represent a logical zero value but may not be able to store sufficient charge to represent a logical one value. Because shaped data may store more logical one values than logical zero values, some bit failures may not be indicated by a bit error rate generated based on shaped data. Thus, if a bit error rate (and a corresponding block health metric) is determined based on shaped data, the bit error rate may not be representative of an average health of the memory block.

DETAILED DESCRIPTION

Particular implementations are described with reference to the drawings. In the description, common features are designated by common reference numbers throughout the drawings. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term).

Figure 1:
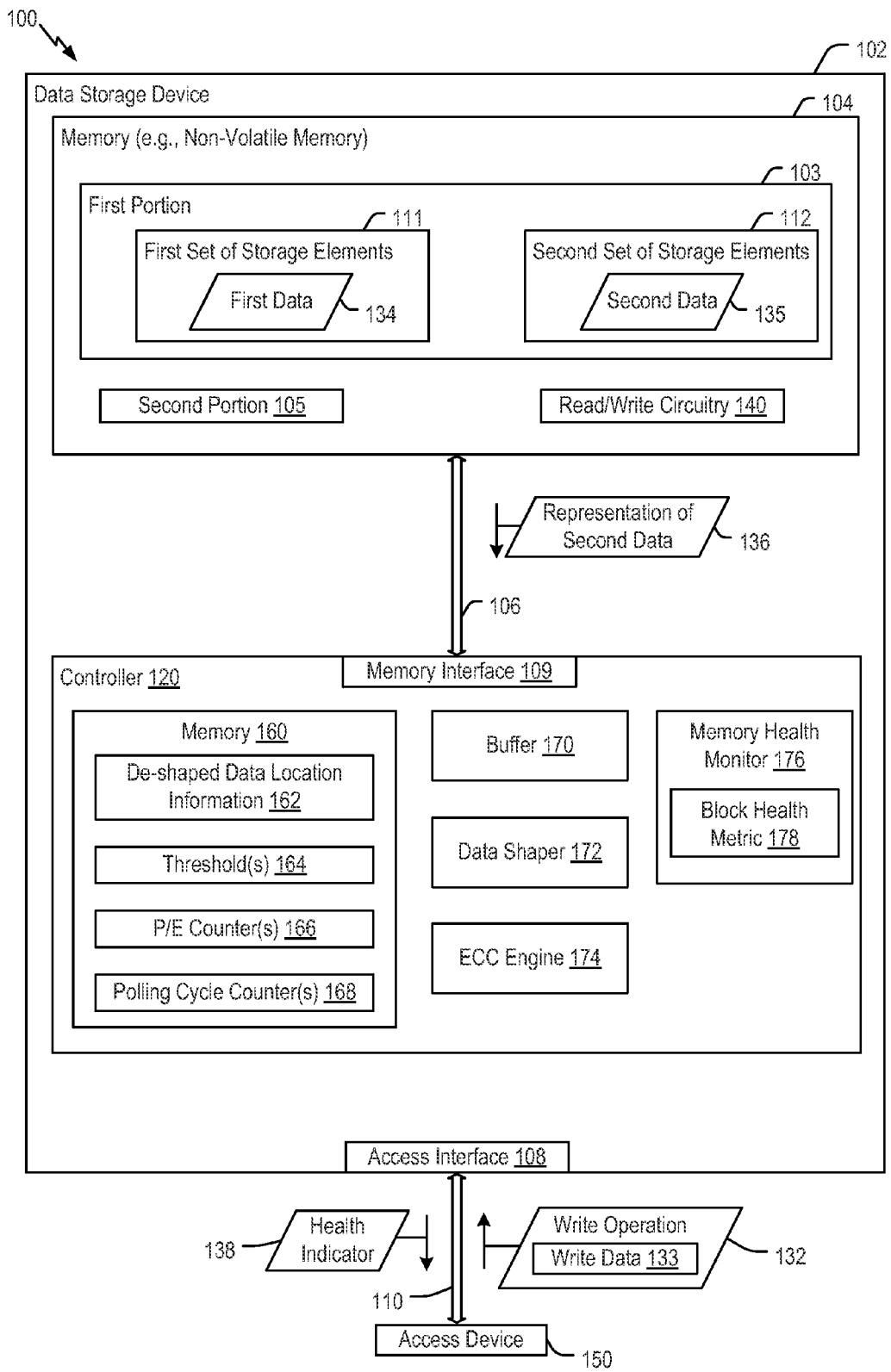
FIG. 1 is a block diagram of a particular illustrative example of a system configured to measure health of a memory that stores at least some shaped data and some de-shaped data.

Referring to FIG. 1, a particular illustrative example of a system is depicted and generally designated 100. The system 100 includes a data storage device 102 and an access device 150. The data storage device 102 includes a controller 120 and a memory 104, such as a non-volatile memory, that is coupled to the controller 120.

The data storage device 102 (e.g., the controller 120) may be configured to write shaped data and at least some de-shaped data to a portion of the memory 104 at particular times. To illustrate, the controller 120 may receive data to be written (e.g., programmed) to a particular portion (e.g., a first portion 103) of the memory 104 from the access device 150. The controller 120 may maintain a count of program and erase (P/E) cycles associated with each portion of the memory 104 using one or more P/E counters 166. A P/E cycle refers to a time period during which a portion (e.g., block) of the memory 104 is erased and then written (e.g., programmed) with data. If the count of P/E cycles associated with the first portion 103 is a multiple of a particular count value, the controller 120 may determine to write some shaped data and some de-shaped data during a current P/E cycle at the first portion 103. As one illustrative, non-limiting example, the controller 120 may be configured to write some shaped data and some de-shaped data to the first portion 103 during each one hundred and twenty-eighth P/E cycle, and during the other 127 P/E cycles, the controller 120 may write shaped data (and no de-shaped data) to the first portion 103.

During the particular P/E cycle, a first portion of write data (e.g., user data) received from the access device 150 may be processed, at a data shaper 172, by one or more data shaping operations to generate first data 134. A second portion of the write data may bypass the data shaper 172 (or may be pre-processed by one or more pre-processing operations prior to being processed by the data shaper 172, as further described herein) to generate second data 135. The first data 134 may include shaped data, and the second data 135 may include de-shaped data. The first data 134 may be written to a first set of storage elements 111 of the first portion 103 and the second data 135 may be written to a second set of storage elements 112 of the first portion 103. After the particular P/E cycle, the first portion 103 of the memory 104 may store some shaped data and some de-shaped data. The shaped data may include more bits that have a first value (e.g., a logical one value) than bits that have a second value (e.g., a logical zero value), and storing bits that have the first value may wear out storage elements slower than storing bits that have the second value. Because the de-shaped data is written to the first portion 103 (to the second set of storage elements 112) during particular P/E cycles and not during other P/E cycles, a large percentage of the data written to the first portion 103 during a lifetime of the memory 104 is shaped data, which reduces wear to the first portion 103.

To determine which storage elements to write de-shaped data to during the particular P/E cycle, the controller 120 may access de-shaped data location information 162. The de-shaped data location information 162 may identify one or more groups of word lines, and the controller 120 may be configured to write de-shaped data to storage elements (e.g., the second set of storage elements 112) accessible via the one or more groups of word lines identified in the de-shaped data location information 162. After the particular P/E cycle, the controller 120 may receive a representation of de-shaped data from storage elements accessible via the one or more groups of word lines identified in the de-shaped data location information 162 during a polling cycle, as further described herein. Additionally, during a read operation subsequent to the particular P/E cycle and prior to a next P/E cycle, the controller 120 may receive a representation of data (e.g., the first data 134 and the second data 135). The controller 120 may process the representation of data associated with the first set of storage elements 111 by one or more data de-shaping operations at the data shaper 172, and the representation of data associated with the second set of storage elements 112 is not processed by the data shaper 172 (based on the second set of storage elements 112 being accessible via the one or more groups of word lines indicated by the de-shaped data location information 162). In some implementations, the one or more groups of word lines may be interspersed with word lines associated with storage of shaped data, such that, after the particular P/E cycle, the first portion 103 stores de-shaped data interspersed with shaped data.

The data storage device 102 (e.g., the controller 120) may be configured to determine (e.g., calculate) a block health metric of a portion (e.g., block) of the memory 104 that is representative of the health of the block. To enable calculation of a block health metric 178 that is representative of the first portion 103, the controller 120 may be configured to periodically initiate a polling cycle at the first portion 103 of the memory 104. For example, after the particular P/E cycle (or a multiple of the particular P/E cycle) at the first portion 103, the controller 120 may initiate a polling cycle at the first portion 103. During the polling cycle, the controller 120 may perform a measurement corresponding to a health of the first portion 103. For example, the controller 120 may receive a representation 136 of the second data 135 from the memory 104 and the controller 120 (e.g., a memory health monitor 176) may determine the block health metric 178 based on the representation 136 and based on a count of P/E cycles maintained by the one or more P/E counters 166. The block health metric 178 may be based on a BER of the representation 136. For example, the controller 120 (e.g., an error correction code (ECC) engine 174) may determine the BER of the representation 136, and the memory health monitor 176 may determine (e.g., calculate) the block health metric 178 for the first portion 103 based on the BER and the count of P/E cycles associated with the first portion 103. After determining the block health metric 178 of the first portion 103 (e.g., the first block) of the memory 104, the controller 120 may initiate one or more actions to increase a useful lifetime of the first portion 103 based on the block health metric.

Because the block health metric 178 is determined based on the representation 136 of the second data 135 (e.g., de-shaped data), the block health metric 178 may be more representative of the actual health of the first portion 103 (e.g., the first block) of the memory 104 than if the block health metric 178 was determined based on a representation of shaped data. To illustrate, at least some failed storage elements may still be able to store the first value, but not the second value. If the storage elements store shaped data (e.g., data with more bits having the first value than bits having the second value), at least some failed storage elements may not cause bit errors. Because the number of bit errors may not be representative of the number of failed storage elements, a block health metric based on shaped data may not be as representative of the health of a portion (e.g., a block) of the memory 104 as a block health metric based on de-shaped data. Thus, the block health metric 178 may be more representative of the health of the first portion 103 than if the block health metric 178 were determined based on shaped data. Because the one or more actions are initiated based on the block health metric 178, the one or more actions may efficiently prolong a useful lifetime of the first portion 103 of the memory 104, as compared to initiating the one or more actions too early (and reducing efficiency) or too late (and reducing effectiveness of the one or more actions).

To enable communications between the data storage device 102 and the access device 150, the data storage device 102 and the access device 150 may be operationally coupled via a connection (e.g., a communication path 110), such as a bus or a wireless connection. For example, the data storage device 102 may include an access interface 108 that enables communication via the communication path 110 between the data storage device 102 and the access device 150. In some implementations, the data storage device 102 may be embedded within the access device 150, such as in accordance with a Joint Electron Devices Engineering Council (JEDEC) Solid State Technology Association Universal Flash Storage (UFS) configuration. Alternatively, the data storage device 102 may be removable from the access device 150 (i.e., "removably" coupled to the access device 150). As an example, the data storage device 102 may be removably coupled to the access device 150 in accordance with a removable universal serial bus (USB) configuration. In some implementations, the data storage device 102 may include or correspond to a solid state drive (SSD) which may be included in, or distinct from (and accessible to), the access device 150. For example, the data storage device may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 may be coupled to the access device 150 indirectly, e.g., via a network. For example, the data storage device 102 may be a network-attached storage (NAS) device or a component (e.g., a solid-state drive (SSD) device) of a data center storage system, an enterprise storage system, or a storage area network.

In some implementations, the data storage device 102 may be configured to be coupled to the access device 150 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

In some implementations, the data storage device 102 and the access device 150 may be configured to communicate using one or more protocols, such as an eMMC protocol, a universal flash storage (UFS) protocol, a universal serial bus (USB) protocol, a serial advanced technology attachment (SATA) protocol, and/or another protocol, as illustrative, non-limiting examples. The one or more protocols may include a standardized protocol and/or a non-standardized protocol, such as a proprietary protocol. In some implementations, the data storage device 102 and the access device 150 may be configured to communicate using dual channel communication (e.g., both devices may issue and receive commands from the other device).

The access device 150 may include a memory interface (not shown) and may be configured to communicate with the data storage device 102 via the memory interface to read data from and write data to the memory 104 of the data storage device. For example, the access device 150 may operate in compliance with a Joint Electron Devices Engineering Council (JEDEC) industry specification, such as a Universal Flash Storage (UFS) Access Controller Interface specification. As other examples, the access device 150 may operate in compliance with one or more other specifications, such as a Secure Digital (SD) Access Controller specification, as an illustrative, non-limiting example. The access device 150 may communicate with the memory 104 in accordance with any other suitable communication protocol.

The access device 150 may include a processor and a memory. The memory may be configured to store data and/or instructions that may be executable by the processor. The memory may be a single memory or may include multiple memories, such as one or more non-volatile memories, one or more volatile memories, or a combination thereof. The access device 150 may issue one or more commands to the data storage device 102, such as one or more requests to erase data, read data from, or write data to the memory 104 of the data storage device 102. For example, the access device 150 may be configured to provide data to be stored at the memory 104 or to request data to be read from the memory 104. The access device 150 may include a mobile telephone, a music player, a video player, a gaming console, an electronic book reader, a personal digital assistant (PDA), a computer, such as a laptop computer or notebook computer, a network computer, a server, any other electronic device, or any combination thereof, as illustrative, non-limiting examples.

The memory 104 of the data storage device 102 may include a non-volatile memory. The memory 104 may have a two-dimensional (2D) memory configuration. Alternatively, the memory 104 may have another configuration, such as a three-dimensional (3D) memory configuration. For example, the memory 104 may include a three-dimensional (3D) memory configuration that is monolithically formed in one or more physical levels of arrays of memory cells having an active area disposed above a silicon substrate. In some implementations, the memory 104 may include circuitry associated with operation of the memory cells (e.g., storage elements).

The memory 104 may include multiple portions. For example, the memory 104 may include the first portion 103 and a second portion 105. The multiple portions may include or correspond to particular groupings of the memory 104. In a particular implementation, the multiple portions correspond to multiple blocks of the memory 104. For example, the first portion 103 corresponds to a first block of the memory 104, and the second portion 105 corresponds to a second block of the memory 104. In some implementations, each block of the memory 104 includes storage elements accessible via one hundred and twenty-eight word lines. In other implementations, blocks of the memory 104 may include more than or fewer than one hundred and twenty-eight word lines. In other implementations, the portions may be a different group of the memory 104, such as word lines, pages, or other groupings as non-limiting examples.

In some implementations, the memory 104 may include a single die, and the multiple portions (e.g., the first portion 103 and the second portion 105) may be included in the single die. In other implementations, the memory 104 may include multiple dies, and the multiple portions may be spread out across the multiple dies. A set of dies of the memory 104 may be logically grouped as a meta plane. A meta block may include a group of multiple blocks that are located in memory dies of the same meta plane that are processed together as if they were a single large block. For example, the meta plane may include two memory dies. In other implementations, a meta plane may include more than two dies. In some implementations, the portions may correspond to meta planes or meta blocks.

The memory 104 may include support circuitry, such as read/write circuitry 140, to support operation of the memory 104. Although depicted as a single component, the read/write circuitry 140 may be divided into separate components of the memory 104, such as read circuitry and write circuitry. The read/write circuitry 140 may be configured to write data to the memory 104. For example, the read/write circuitry 140 may be configured to receive the first data 134 and the second data 135 from the controller 120 and to write the first data 134 to the first set of storage elements 111 (based on an address in a write operation associated with the first data 134) and the second data 135 to the second set of storage elements 112 (based on an address in a write command associated with the second data 135). The read/write circuitry 140 may also be configured to read a representation of data from the memory 104 based on requests from the controller 120. For example, in response to a first request for read data (indicating an address associated with the first set of storage elements 111), the read/write circuitry 140 may perform a sensing operation to read a representation of the first data 134. The representation of the first data 134 may include data corresponding to the first data 134 that may have one or more bit errors, as well as one or more check bits, one or more parity bits, one or more ECC codewords, or other decoding information for use by the ECC engine 174. As another example, in response to a second request for read data (indicating an address associated with the second set of storage elements 112), the read/write circuitry 140 may perform a sensing operation to read a representation 136 of the second data 135. After reading the representations of the first data 134 and the second data 135, the representations of the first data 134 and the second data 135 may be provided to the controller 120.

The controller 120 is coupled to the memory 104 via a bus 106, an interface (e.g., interface circuitry, such as a memory interface 109), another structure, or a combination thereof. In some implementations, the bus 106 may include multiple distinct channels to enable the controller 120 to communicate with multiple portions of the memory 104 in parallel with, and independently of, communication with the other portions of the memory 104. In some implementations, the memory 104 may be a flash memory, as an illustrative, non-limiting example. The controller 120 and the memory 104 may exchange information via the bus 106, the memory interface 109, or a combination thereof. For example, one or more of the representation of the first data 134, the representation 136 of the second data 135, one or more requests for read data, one or write commands (or requests to write data), or a combination thereof, may be exchanged between the controller 120 and the memory 104.

The controller 120 is configured to receive data and instructions from the access device 150 and to send data to the access device 150. For example, the controller 120 may send data to the access device 150 via the access interface 108, and the controller 120 may receive data from the access device 150 via the access interface 108. The controller 120 is configured to send data and commands to the memory 104 and to receive data from the memory 104. For example, the controller 120 is configured to send data and a write command to cause the memory 104 to store data to a specified address of the memory 104. The write command may specify a physical address of a portion of the memory 104 (e.g., a physical address of a word line of one of the portions 103 and 105 of the memory 104) that is to store the data. The controller 120 may also be configured to send data and commands to the memory 104 associated with health monitoring operations (e.g., polling operations), wear leveling operations, and other operations, as illustrative, non-limiting examples. The controller 120 is configured to send a read command to the memory 104 to access data from a specified address of the memory 104. The read command may specify the physical address of a portion of the memory 104 (e.g., a physical address of a word line of one of the portions 103 and 105 of the memory 104).

The controller 120 is configured to initiate portions of the memory 104 to be erased and, after data is erased from the portions, to initiate data being written to the erased portions of the memory 104. For example, the controller 120 may initiate data erasure at the first portion 103 (e.g., by sending an erase command to the memory 104), and after the first portion 103 is erased, the controller 120 may initiate writing of data to the first portion 103 (e.g., by sending a write command to the memory 104). The data to be written to the first portion 103 may be based on data received from the access device 150, data stored at the memory 104 (e.g., in a different portion or in the same portion), or a combination thereof. A time period during which the first portion 103 is erased and then written (e.g., programmed) with data may be referred to as a program and erase (P/E) cycle. Each portion of the memory 104 may undergo multiple P/E cycles during a lifetime of the memory 104.

The controller 120 may also be configured to perform one or more measurements to monitor the health of the memory 104, or portions (e.g., blocks) thereof, during polling cycles. For example, the controller 120 may initiate one or more actions and may receive a representation of data from the first portion 103 for use in performing one or more measurements of the health of the first portion 103. During the polling cycle, the controller 120 may read a representation of data from the first portion 103 (e.g., a first block) of the memory 104 and determine the block health metric 178, as further described herein. A particular time between P/E cycles that is designated for performance of the memory health monitoring is referred to as a polling cycle. In some implementations, the polling cycle associated with a particular portion of the memory 104 occurs after each one hundred and twenty-eighth P/E cycle associated with the particular portion.

The controller 120 may include a second memory 160, a buffer 170, a data shaper 172, the ECC engine 174, and a memory health monitor 176. The second memory 160 may include de-shaped data location information 162, one or more thresholds 164, one or more P/E counters 166, and one or more polling cycle counters 168. Although the de-shaped data location information 162 is described as being stored at the second memory 160 of the controller 120, in an alternative implementation, the de-shaped data location information 162 may be stored at the memory 104.

The de-shaped data location information 162 may identify a group of word lines where de-shaped data is to be stored during a polling cycle. For example, the de-shaped data location information 162 may identify a group of word lines of a portion of the memory 104, and during a polling cycle of the portion, storage elements accessible via the group of word lines may store de-shaped data. Storage elements accessible via the other word lines may store shaped data. In a particular implementation, the de-shaped data location information 162 may be a table that identifies the group of word lines. The group of word lines is a subset of the word lines of the portion (e.g., block). In a particular implementation, a portion (e.g., block) of the memory 104 includes one hundred and twenty-eight word lines, and the group of word lines includes approximately sixteen to twenty word lines of the one hundred and twenty-eight word lines in the portion. Storage elements accessible via the group of word lines may be written with de-shaped data during a P/E cycle prior to a polling cycle. In some implementations, the portion of the memory 104 may be a closed portion (e.g., a closed block) during the polling cycle, as further described with reference to FIG. 2. In other implementations, the portion of the memory 104 may be an open portion (e.g., an open block) during the polling cycle, as further described with reference to FIG. 3. Because storing shaped data reduces wear to the memory 104 as compared to storing de-shaped data, the group of word lines may be a small subset of the total word lines in the portion (e.g., block) of the memory 104. Thus, storing information identifying the group of word lines associated with de-shaped data may use less memory than storing information identifying a group of word lines associated with shaped data. In other implementations, the second memory 160 may include information identifying word lines associated with storage of shaped data during polling cycles.

In a particular implementation, the first portion 103 (e.g., the first block) includes one hundred and twenty-eight word lines, and the first group of word lines identified by the de-shaped data location information 162 includes sixteen word lines. Sixteen word lines may be selected to give a representative sampling of storage elements in the first portion 103 while keeping the number of word lines that store de-shaped data (and thus do not reduce wear to the storage elements) low. In other implementations, the group of word lines may include more than or fewer than sixteen word lines. In a particular implementation, the group of word lines is interspersed among word lines that are associated with shaped data. In a particular embodiment, the group of word lines includes four sets of four word lines. For example, the group of word lines may include word lines 1-4, 33-36, 64-67, and 96-99. In other implementations, the group of word lines may identify other word lines, or other sets of word lines having more than or fewer than four word lines per set of word lines.

In some implementations, the de-shaped data location information may identify a single group of word lines, and the single group of word lines may be associated with storing de-shaped data in each portion of the memory 104. For example, the same group of word lines may be used for writing de-shaped data to each portion (e.g., block) of the memory 104. In other implementations, the de-shaped data location information 162 (e.g., the table) includes multiple entries. In some implementations, each of the entries in the de-shaped data location information 162 may be associated with a different portion (e.g., block) of the memory 104. For example, the memory 104 may be divided into multiple portions, and each of the multiple portions may be associated with a corresponding entry in the table. In this manner, the de-shaped data location information 162 (e.g., the table) may identify different groups of word lines for different portions (e.g., blocks) of the memory 104.

In some implementations, a group of word lines identified by the de-shaped data location information 162 may be associated with each polling cycle of a corresponding portion of the memory 104. For example, during each P/E cycle that is a multiple of x (e.g., each P/E cycle immediately prior to a polling cycle), de-shaped data may be written to storage elements accessible via the group of word lines. In other implementations, the de-shaped data location information 162 may identify different groups of word lines for different polling cycles. For example, the de-shaped data location information 162 may identify a first group of word lines associated with a particular portion of the memory 104 and associated with a first polling cycle. The de-shaped data location information 162 may also identify a second group of word lines associated with the particular portion and associated with a second polling cycle. In some implementations, the group of word lines may be a group of contiguous word lines. In other implementations, the group of word lines may include at least some word lines that are not contiguous with other word lines in the group of word lines. In some implementations, the non-contiguous group of word lines may have a periodic pattern.

To illustrate, the de-shaped data location information 162 may identify a first group of word lines associated with a first set of polling cycles and a second group of word lines associated with a second polling cycle. In this example, the first group of word lines may include word lines {1, 2, 3, 4, 32, 33, 34, 35, 64, 65, 66, 67, 96, 97, 98, 99, 125, 126, 127, and 128} and may be associated with polling cycles that are multiples of x and that are not multiples of 2x, and the second group of word lines may include word lines {5, 6, 7, 8, 36, 37, 38, 39, 68, 69, 70, 71, 100, 101, 102, 103, 121, 122, 123, and 124} and may be associated with polling cycles that are multiples of 2x. During a P/E cycle (e.g., a one hundred and twenty-eighth P/E cycle) immediately prior to a first polling cycle (or a third polling cycle, a fifth polling cycle, etc.), de-shaped data may be written to storage elements accessible via the first group of word lines, and during a P/E cycle (e.g., a 256th PE cycle) immediately prior to a second polling cycle (or a fourth polling cycle, a sixth polling cycle, etc.), de-shaped data may be written to storage elements accessible via the second group of word lines. In this manner, different storage elements of a portion of the memory 104 may store de-shaped data during different polling cycles of the portion.

The one or more groups of word lines identified by the de-shaped data location information 162 may be selected during a design process of the data storage device 102. For example, a designer may determine which word lines should be associated with de-shaped data during polling cycles, and the de-shaped data location information 162 may be programmed into the second memory 160 of the controller 120. The one or more groups of word lines may be selected during design of the data storage device 102 such that physical differences between word lines of a memory block are captured. For example, the one or more groups of word lines may span a memory block as compared to representing word lines only at the beginning or only at the end of the block. Additionally, the one or more groups of word lines may be selected by a designer based on Yupin effects of de-shaped data on adjacent shaped data.

In addition to storing the de-shaped data location information 162, the second memory 160 includes the one or more thresholds 164. The one or more thresholds 164 may be used by the controller 120, such as the memory health monitor 176, to determine the block health metric 178, as described further herein. The one or more thresholds 164 may include one or more bit error rate thresholds. Additionally or alternatively, the one or more thresholds 164 may include one or more memory health thresholds.

Additionally, the second memory 160 includes the one or more P/E counters 166. The one or more P/E counters 166 may be configured to track a number of P/E cycles associated with portions of the memory 104. For example, a first P/E counter of the one or more P/E counters 166 may track a number of P/E cycles associated with the first portion 103 of the memory 104. To illustrate, each time a P/E cycle occurs or is completed at the first portion 103 of the memory 104, the first P/E counter is incremented. In some implementations, the one or more P/E counters 166 may include at least one counter for each portion (e.g., block) of the memory 104. For example, the one or more P/E counters 166 may include a counter for each portion (of the memory 104) that is configured to operate as described with reference to the first P/E counter described above. The counts of P/E cycles maintained by the one or more P/E counters 166 may be used by the controller 120, such as the memory health monitor 176, to determine one or more block health metrics, as further described herein.

In addition to the de-shaped data location information 162, the one or more thresholds 164, and the one or more P/E counters 166, the second memory 160 includes the one or more polling cycle counters 168. The one or more polling cycle counters 168 may be configured to track a number of polling cycles associated with portions of the memory 104. For example, a first polling cycle counter of the one or more polling cycle counters 168 may track a number of polling cycles associated with the first portion 103 of the memory 104. To illustrate, each time a polling cycle is initiated or completed at the first portion 103 of the memory 104, the first polling cycle counter is incremented. In some implementations, the one or more polling cycle counters 168 may include at least one counter for each portion (e.g., block) of the memory 104. For example, the one or more polling cycle counters 168 may include a counter for each portion (of the memory 104) that is configured to operate as described with reference to the first polling cycle counter described above. In some implementations, the counts of polling cycles maintained by the one or more polling cycle counters 168 may be used by the controller 120 to select a group of word lines identified in the de-shaped data location information 162.

The buffer 170 may be configured to buffer data passed between the access device 150 and the memory 104. For example, data received from the access device 150 may be stored at the buffer 170 prior to being written to the memory 104. In some implementations, the data received from the access device 150 may be encoded prior to being stored at the buffer 170. For example, the data may be encoded by the ECC engine 174. As another example, some or all of the data may be processed by the data shaper 172 prior to being stored in the buffer 170. As another example, representations of data received from the memory 104 may be stored at the buffer 170 prior to being provided to the access device 150. In some implementations, the representations of data received from the memory 104 may be decoded prior to being stored at the buffer 170. For example, the data may be decoded by the ECC engine 174. As another example, the data may be de-shaped by the data shaper 172.

The data shaper 172 may be configured to perform one or more data shaping operations on data prior to the controller 120 writing the data to the memory 104. Additionally, the data shaper 172 may be configured to perform one or more data de-shaping operations (e.g., inverse data shaping operations) on data read by the controller 120 from the memory 104. Each of the one or more data shaping operations may be configured to generate shaped data having a larger number of bits having a first value than bits having a second value. In a particular implementation, the first value is a logical one value, and the second value is a logical zero value. For example, the one or more data shaping operations may receive data having a substantially equal distribution of bits having the first value and bits having the second value, and the one or more data shaping operations may output shaped data having a larger number of bits having the first value than bits having the second value. The one or more data shaping operations may include mapping operations, logical operations, or other operations that generate data having a larger number of bits having the first value than bits having the second value. As a particular, non-limiting example, the one or more data shaping operations may include an adaptive general bit flipping (AGBF) operation.

The one or more data shaping operations may be used to reduce wear at the memory 104. For example, storage elements of the memory 104 that store bits that have the second value (e.g., a logical zero value) may "wear out" faster than storage elements that store bits that have the first value (e.g., a logical one value). Because the one or more data shaping operations reduces the number of bits having the second value (e.g., a logical zero value), writing shaped data to the memory 104 may wear out the memory 104 slower than writing de-shaped data (e.g., data with a nearly equal amount of bits having the first and second values) to the memory 104. In some implementations, in order to further reduce the number of bits having the second value, the data shaper 172 may apply multiple data shaping operations to data prior to writing the shaped data to the memory 104. As used herein, a "shaping level" of shaped data refers to a number of data shaping operations performed on the shaped data. For example, shaped data having a higher shaping level has been processed by more data shaping operations than shaped data having a lower shaping level.

During each P/E cycle other than a P/E cycle immediately prior to a polling cycle, the data shaper 172 may perform the one or more data shaping operations on data to be written to first portion 103 the memory 104. Storing shaped data at the first portion 103 may reduce wear at the first portion 103, as compared to writing de-shaped data to the first portion 103. However, if the block health metric 178 is determined based on shaped data, the block health metric 178 may not be as accurate a representation of the health of the first portion 103 as if the block health metric 178 is based on de-shaped data having a nearly (e.g., substantially) equal number of bits having a first value (e.g., a logical one value) and bits having a second value (e.g., a logical zero value). For example, bit errors may be more likely to occur when bits have the second value. If the bit error rate is determined based on a representation of shaped data, the bit error rate may be determined to be lower than if the bit error rate was determined based on a substantially (e.g., nearly) equal distribution of bits having the first value and bits having the second value (e.g., unshaped data). Based on the lower bit error rate, a lower block health metric may be determined that does not accurately reflect the health of the first portion 103 of the memory 104. Thus, measuring the health of a portion of the memory 104 using shaped data may not result in sufficiently accurate health measurements. To enable determination of more accurate block health metrics, the controller 120 may be configured to store at least some de-shaped data at the memory 104 at particular times, as described above.

Although de-shaped data is described as data that is not processed by the one or more data shaping operations, in other implementations, de-shaped data may refer to data that is first processed by a data pre-processing operation and then processed by the one or more data shaping operations. In some implementations, the controller 120 may be configured to process data using a data pre-processing operation. The data pre-processing operation may include mapping operations, logical operations, or other operations that change values of the data. The data pre-processing operation may be configured to generate pre-processed data that, when processed by the one or more data shaping operations, results in data having a substantially equal number of bits having a first value (e.g., a logical one value) and bits having a second value (e.g., a logical zero value). In these implementations, the data shaper 172, or the controller 120, may process a portion of data to be written to the memory 104 using the data pre-processing operation prior to the data shaper 172 processing the entirety of the data to be written to the memory. Thus, in both implementations, de-shaped data has a substantially (e.g., nearly) equal number of bits having a first value (e.g., a logical one value) and a second value (e.g., a logical zero value), which may also be referred to as a random distribution of bits having the first value and bits having the second value. In implementations where the de-shaped data is processed by the data pre-processing operation, the controller 120 may be configured to perform an inverse data pre-processing operation on representations of de-shaped data read from the memory 104 as part of a decoding and/or reading process.

The controller 120 also includes the ECC engine 174. The ECC engine 174 may be configured to receive data, such as the write data 133, and to generate one or more error correction code (ECC) codewords (e.g., including a data portion and a parity portion) based on the data. For example, the ECC engine 174 may receive the write data 133 and may generate a codeword. To illustrate, the ECC engine 174 may include an encoder configured to encode the data using an ECC encoding technique. The ECC engine 174 may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples.

The ECC engine 174 may include a decoder configured to decode data read from the memory 104 to detect and correct bit errors that may be present in the data. For example, the ECC engine 174 may correct a number of bit errors up to an error correction capability of an ECC technique used by the ECC engine 174. A number of errors identified by the ECC engine 174 may be tracked by the controller 120, such as by the ECC engine 174. During a polling cycle of a portion of the memory 104, a number of bit errors in a representation of data stored at the portion may be tracked and compared to the one or more thresholds 164 as part of the controller 120 monitoring the health of the portion.

In some implementations, the controller 120, such as the ECC engine 174, the data shaper 172, or a combination thereof, may perform a normalization operation on the bit error rate prior to using the bit error rate to determine a block health metric. The normalization operation may be performed based on a shaping level associated with data shaping performed by the data shaper 172. For example, in some implementations, de-shaped data refers to data that has been processed by a data pre-processing operation prior to being processed by one or more data shaping operations. In these implementations, after determining a bit error rate based on a representation of de-shaped data, the normalization operation may be performed on the bit error rate to account for non-equal distribution of bits having a first value (e.g., a logical one value) and bits having a second value (e.g., a logical zero value) based on a data shaping level associated with the one or more data shaping operations. In other implementations, the normalization operation may not be performed, and the representation of the data may have a substantially equal distribution of bits having the first value and bits having the second value.

The memory health monitor 176 may be configured to monitor the health of the memory 104 during a lifetime of the memory 104. For example, the memory health monitor 176 may monitor the health of one or more portions (e.g., blocks) of the memory 104, or a health of the memory 104 as a whole. Health of a portion of the memory 104 may be monitored during a polling cycle corresponding to the portion. During the polling cycle, the memory health monitor 176 may monitor the health of the portion of the memory 104. For example, the controller 120 may read a representation of data stored at the portion of the memory 104 and, based on the representation of the data, the controller 120 may determine a block health metric corresponding to the portion. The block health metric may indicate a health of the portion of the memory 104. For example, the block health metric may indicate whether a particular portion of the memory 104 is wearing out faster than other portions of the memory 104.

The block health metric for the portion of the memory 104 may be determined based on a bit error rate of the representation of data stored at the portion and the count of the P/E cycles corresponding to the portion. A high bit error rate and/or a high count of the P/E cycles may result in a block health metric having a high value. A comparison between block health metrics associated with different portions of the memory 104 may indicate a relative health of a particular portion of the memory 104 as compared to other portions. For example, a portion of the memory 104 that has a higher block health metric than other portions of the memory 104 may be wearing out faster than the other portions. In some implementations, the block health metric may be determined based on a comparison of the bit error rate to bit error rate threshold(s) of the one or more thresholds 164. For example, if the bit error rate fails to exceed a first threshold, a block health metric indicating a "good" health may be determined. As another example, if the bit error rate exceeds a first threshold but fails to exceed a second threshold, a block health metric associated with the portion may indicate a shorter remaining life of the portion than a portion associated with a block health metric that indicates "good" health.

After determining a block health metric, the controller 120 may be configured to initiate one or more actions based on the block health metric. To determine the one or more actions, the controller 120 may compare the block health metric to memory health threshold(s) of the one or more thresholds 164. For example, the controller 120 may determine to take one or more actions when a block health metric exceeds a memory health threshold of the one or more thresholds 164. The actions may include one or more actions to reduce wear at a particular portion of the memory 104, to prolong life of the portion of the memory 104, to indicate a health of a portion (or an entirety) of the memory 104, or some other action. For example, the controller 120 may reduce a frequency that the particular portion of the memory 104 is programmed when the block health metric exceeds a first memory health threshold of the one or more thresholds 164. To illustrate, the controller 120 may maintain a table indicating a frequency of programming associated with each of the portions of the memory 104, and if the block health metric 178 of the first portion 103 exceeds a first memory threshold, the frequency of programming associated with the first portion 103 may be decreased. Reducing the frequency of programming at the portion may prolong the useful life of the portion. As another example, the controller 120 may increase a data shaping level of data written to the portion. Increasing the data shaping level of data written to the portion (e.g., the first portion 103) may further prolong the useful life of the portion. As another example, the controller 120 may map data to be stored at the portion to other portions when the block health metric exceeds a second threshold of the one or more thresholds 164. The second threshold may indicate a block health metric associated with a failure, or impending failure, of the portion of the memory 104, and the controller 120 may mark the portion (e.g., in a table or other data structure) as no longer being usable for writing and reading operations.

In some implementations, the controller 120 may determine a health metric of the memory 104 as a whole based on block health metrics corresponding to each portion of the memory 104. The health metric may be used to initiate one or more actions by the controller 120. As example, the controller 120 may increase a data shaping level of data written to the memory 104. Additionally, the controller 120 may provide a health indicator 138 to the access device 150. The health indicator may indicate one or more block health metrics of one or more portions of the memory 104, a health metric of the memory 104 (e.g., a health metric of the memory 104 as a whole), or a combination thereof.

During operation, the data storage device 102 may receive commands from the access device 150. For example, the data storage device 102 may receive a write operation 132 from the access device 150. The write operation 132 may include write data 133 and may include an address associated with the first portion 103 of the memory 104. For example, the write operation 132 may indicate an address of one or more storage elements in the first portion 103 of the memory 104. The controller 120 may determine whether a current P/E cycle of the first portion 103 immediately precedes a polling cycle of the first portion 103. For example, the controller 120 may access a particular counter of the one or more P/E counters 166 to determine a count of P/E cycles corresponding to the first portion 103. If the count of P/E cycles is a multiple of a particular count value, a polling cycle may be scheduled to occur at the first portion 103 subsequent to the current P/E cycle and prior to a next P/E cycle.

If the count of P/E cycles indicates that a polling cycle does not occur before a next P/E cycle at the first portion 103, the controller 120 generates shaped data based on the write data 133. For example, that write data 133 may be provided to the data shaper 172, and the data shaper 172 may process the write data 133 using one or more data shaping operations to generate shaped data. After generating the shaped data, the controller 120 may write the shaped data to the first portion 103 of the memory 104. Writing shaped data to the first portion 103 of the memory 104 during most P/E cycles (e.g., P/E/cycles that do not immediately precede a polling cycle) reduces wear to the first portion 103, as compared to writing de-shaped data during most P/E cycles.

If the count of P/E cycles indicates that a polling cycle is to occur as the next cycle at the first portion 103 (e.g., if the count of P/E cycles is a multiple of a particular number, such as one hundred and twenty-eight as a non-limiting example), the controller 120 determines that the that some shaped data and some de-shaped data is to be written to the first portion 103 of the memory 104. The controller 120 may generate the first data 134 and the second data 135 based on the write data 133. In a particular implementation, the first data 134 is provided to the data shaper 172 such that the first data 134 is processed by one or more data shaping operations, and the second data 135 is not provided to the data shaper 172, such that the second data 135 is de-shaped data. In an alternate implementation, the second data 135 is processed by a data pre-processing operation prior to the first data 134 and the second data 135 being processed by one or more data shaping operations. In both implementations, the second data 135 is de-shaped data having a substantially equal number of bits having a first value (e.g., a logical one value) and bits having a second value (e.g., a logical zero value).

In some implementations, the first data 134 and the second data 135 may be buffered in the buffer 170 prior to being processed by the one or more data shaping operations or prior to being written to the memory 104. In other implementations, the buffer 170 is not included in the controller 120 and the first data 134 and the second data 135 are processed without buffering. Additionally, the first data 134 and the second data 135 may be processed by the ECC engine 174 prior to or after the one or more data shaping operations are used to process the first data 134 and the second data 135. Processing performed by the ECC engine 174 may include correcting one or more errors or generating one or more codewords, as non-limiting examples.

After the first data 134 is processed by the data shaper 172, the controller 120 writes the first data 134 to a first set of storage elements 111 of the first portion 103 of the memory 104. The controller 120 also writes the second data 135 to a second set of storage elements 112 of the first portion 103 of the memory 104. To determine which storage elements are to store de-shaped data, the controller 120 may access the de-shaped data location information 162. For example, the second set of storage elements 112 may be accessible via a group of word lines identified in the de-shaped data location information 162. In some implementations, the controller 120 may use a count of polling cycles associated with the first portion 103 of the memory 104 to select a particular group of word lines from multiple groups of word lines identified by the de-shaped data location information 162. For example, the controller 120 may access a particular counter of the one or more polling cycle counters 168 to determine a count of polling cycles corresponding to the first portion 103, and the second set of storage elements 112 may be selected based on the count of polling cycles. The first set of storage elements 111 may be accessible via other word lines in the first portion 103 (e.g., block) of the memory 104. In some implementations, the group of word lines (via which the second set of storage elements 112 is accessible) may be interspersed among the other word lines of the first portion 103 in a periodic pattern.

During a polling cycle of the first portion 103 of the memory 104, the controller 120 reads a representation 136 of the second data 135 from the first portion 103. During the polling cycle, a representation of the first data 134 is not read. In some implementations, the representation 136 of the second data 135 is read after completion of programming the first portion 103 of the memory 104. For example, after the P/E cycle in which the first data 134 and the second data 135 are written to the first portion 103, the first portion 103 may be a closed block of the memory 104, as further described with reference to FIG. 2. In other implementations, the representation 136 of the second data 135 is read prior to completion of programming the first portion 103 of the memory 104. For example, after the P/E cycle in which the first data 134 and the second data 135 are written to the first portion 103, the first portion 103 may be an open block of the memory 104, as further described with reference to FIG. 3.

The controller 120 may determine a block health metric 178 of the first portion 103 of the memory 104 (e.g., a block of the memory including the first set of storage elements 111 and the second set of storage elements 112) based on the representation of the second data 135 (e.g., the de-shaped data). The block health metric 178 may be determined based on a bit error rate of the representation 136 of the second data 135 and based on a count of the P/E cycles of the portion of the non-volatile memory 104. In some implementations, if the second data 135 was processed by a data pre-processing operation and the one or more data shaping operations prior to being written to the second set of storage elements 112, the controller 120 may perform a normalization operation (based on a data shaping level of the second data 135) on the bit error rate prior to determining the block health metric 178.

After determining the block health metric 178 of the first portion 103 of the memory 104, the controller 120 may initiate one or more actions based on the block health metric. For example, the controller 120 may reduce a frequency that the first portion 103 of the memory 104 is programmed when the block health metric 178 exceeds a first memory health threshold of the one or more thresholds 164, as one non-limiting example. Additionally, the controller 120 may determine block health metrics for other portions of the memory 104 or determine a memory health of the memory 104 as a whole. The controller 120 may also provide a health indicator 138 to the access device 150. The health indicator 138 may indicate one or more of the block health metrics and/or the memory health of the memory 104.

In some implementations, the de-shaped data location information 162, the one or more thresholds 164, the one or more P/E counters 166, the one or more polling cycle counters 168, or a combination thereof, may be stored at the memory 104. In other implementations, the controller 120 may include or may be coupled to a particular memory (e.g., the second memory 160), such as a random access memory (RAM), that is configured to store the de-shaped data location information 162, the one or more thresholds 164, the one or more P/E counters 166, the one or more polling cycle counters 168, or a combination thereof. Alternatively, or in addition, the controller 120 may include or may be coupled to another memory (not shown), such as a non-volatile memory, a RAM, or a read only memory (ROM). The other memory may include a single memory component, multiple distinct memory components, and/or may include multiple different types (e.g., volatile memory and/ or non-volatile) of memory components. In some embodiments, the other memory may be included in the access device 150.

In a particular implementation, the data storage device 102 includes the controller 120 and the non-volatile memory 104 coupled to the controller 120. The non-volatile memory 104 includes storage elements configured to store data, and the storage elements are organized into multiple portions. At least one portion stores de-shaped data and shaped data. For example, the data storage device 102 includes the controller 120 and the memory 104 (e.g., a non-volatile memory). The memory 104 includes storage elements and is organized into multiple portions (e.g., at least the first portion 103 and the second portion 105). After a particular P/E cycle, the first portion 103 stores de-shaped data and shaped data.

In another particular implementation, the data storage device 102 includes the controller 120 and the non-volatile memory 104 coupled to the controller 120. The non-volatile memory 104 includes storage elements configured to store data, and the storage elements are organized into multiple blocks. At least one block stores de-shaped data that is interspersed with shaped data within the at least one block according to a periodic pattern. For example, the data storage device 102 includes the controller 120 and the memory 104 (e.g., a non-volatile memory). The memory 104 includes storage elements and is organized into multiple blocks (e.g., at least the first portion 103 and the second portion 105). After a particular P/E cycle, the first portion 103 stores de-shaped data that is interspersed with shaped data according to a periodic pattern indicated by the one or more groups of word lines identified in the de-shaped data location information 162.

Although one or more components of the data storage device 102 have been described with respect to the controller 120, in other implementations certain components may be included in the memory 104. For example, one or more of the second memory 160, the buffer 170, the data shaper 172, the ECC engine 174, and/or the memory health monitor 176 may be included in the memory 104. Alternatively, or in addition, one or more functions as described above with reference to the controller 120 may be performed at or by the memory 104. For example, one or more functions of the second memory 160, the buffer 170, the data shaper 172, the ECC engine 174, and/or the memory health monitor 176 may be performed by components and/or circuitry included in the memory 104. Alternatively, or in addition, one or more components of the data storage device 102 may be included in the access device 150. For example, one or more of the second memory 160, the buffer 170, the data shaper 172, the ECC engine 174, and/or the memory health monitor 176 may be included in the access device 150. Alternatively, or in addition, one or more functions as described above with reference to the controller 120 may be performed at or by the access device 150. As an illustrative, non-limiting example, the access device 150 may be configured to write de-shaped data to the memory 104 and to determine a block health metric based on a representation of de-shaped data read from the memory 104 and a count of P/E cycles.

By storing at least some de-shaped data at a portion (e.g., a block) of the memory 104 prior to a polling cycle of the portion, the data storage device 102 may enable an accurate block health metric to be determined for the portion. For example, by writing at least some de-shaped data to the portion during a P/E cycle immediately prior to a polling cycle, de-shaped data may be read during the polling cycle and a more accurate block health metric may be determined based on the de-shaped data as compared to determining the block health metric based on shaped data. Additionally, the data storage device 102 may reduce wear to the portion of the memory 104 by writing shaped data to the entire portion (e.g., block) during other P/E cycles. Because only some de-shaped data is written to the portion during a fraction of the P/E cycles of the portion, determination of the more accurate block health metric is enabled with only a slight increase in wear to the memory 104.

Figure 2:
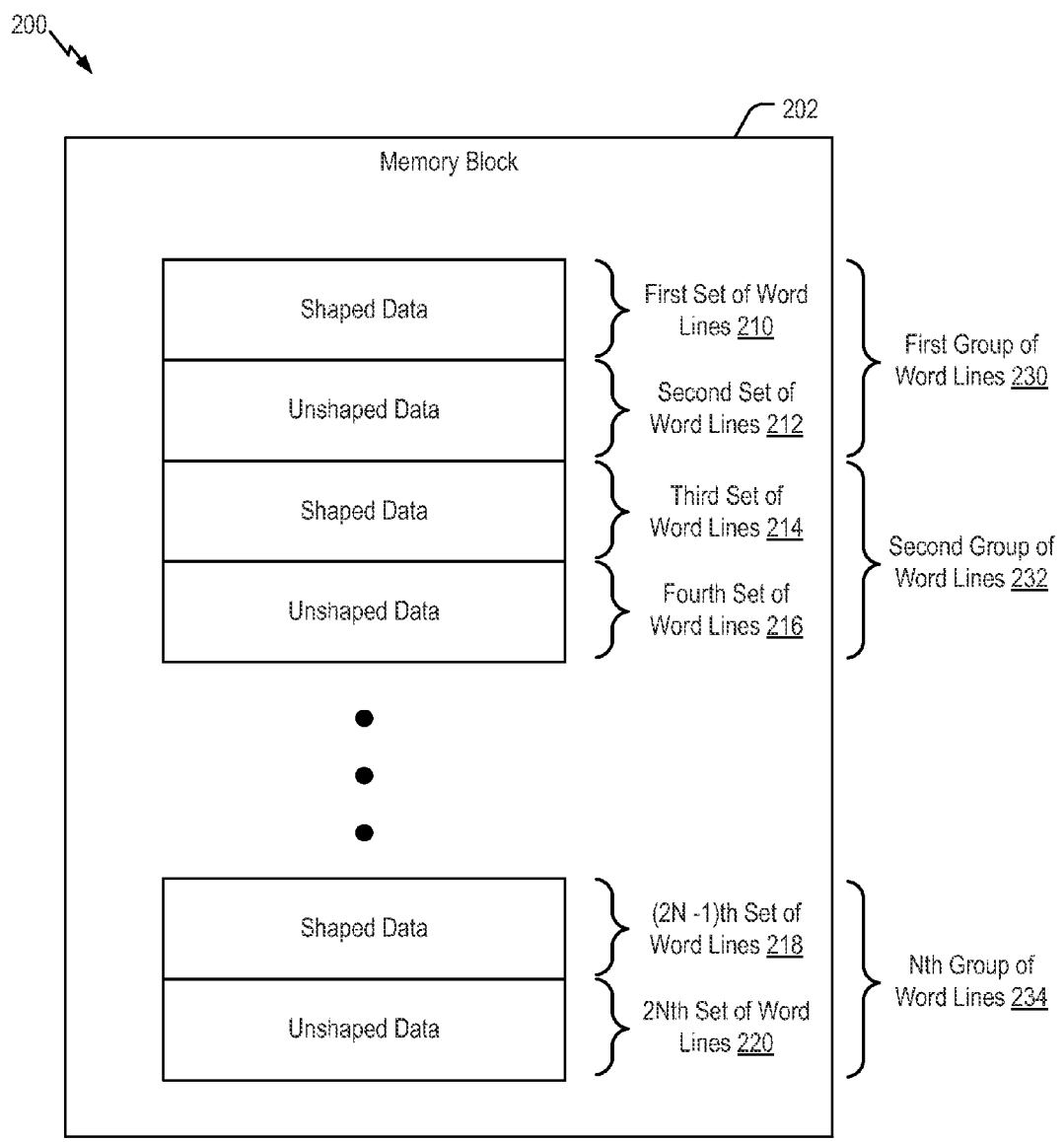
FIG. 2 is a block diagram that illustrates a closed block of the memory 104 of FIG. 1 that stores shaped data and de-shaped data.

Referring to FIG. 2, a diagram 200 of an illustrative example of a closed memory block 202 of the data storage device 102 of FIG. 1 is illustrated. In some implementations, the closed memory block 202 may include or correspond to the first portion 103 of the memory 104 of FIG. 1. FIG. 2 illustrates the closed memory block 202 during a polling cycle of the closed memory block 202.

The closed memory block 202 includes a plurality of word lines. For example, the closed memory block 202 may include a first group of word lines 230 that includes a first set of word lines 210 and a second set of word lines 212, a second group of word lines 232 that includes a third set of word lines 214 and a fourth set of word lines 216, and a Nth group of word lines 234 that includes a (2N−1)th set of word lines 218 and a 2Nth set of word lines 220. One or more storage elements may be accessible via each of the word lines and may be configured to store data. For example, the storage elements may store single-level cell (SLC) data, multi-level cell (MLC) data, or other data.

After a particular program and erase (P/E) cycle of the memory block 202, the memory block 202 may be closed and may store shaped data and de-shaped data. For example, storage elements accessible via the first set of word lines 210, the third set of word lines 214, and the (2N−1)th set of word lines 218 may store shaped data, and storage elements accessible via the second set of word lines 212, the fourth set of word lines 216, and the 2Nth set of word lines 220 may store de-shaped data. In other implementations, the second set of word lines 212, storage elements accessible via the fourth set of word lines 216, and the 2Nth set of word lines 220 may store data that is processed by a data pre-processing operation prior to being processed by one or more data shaping operations, such that the data has the same characteristics as de-shaped data. The second set of word lines 212, the fourth set of word lines 216, and the 2Nth set of word lines 220 may be identified by the de-shaped data location information 162 of FIG. 1.

As illustrated in FIG. 2, the closed memory block 202 may store de-shaped data that is interspersed with the shaped data in a periodic pattern. As a particular example, each group of word lines may include thirty-two word lines, and the closed memory block 202 may include one hundred and twenty-eight word lines, such that N is four in this example. In this example, de-shaped data may be stored at storage elements accessible via sets of four word lines, and shaped data may be stored at storage elements accessible via sets of 28 word lines. For example, the first set of word lines 210, the third set of word lines 214, and the (2N−1)th set of word lines 218 may include 28 word lines, and the second set of word lines 212, the fourth set of word lines 216, and the 2Nth set of word lines 220 may include four word lines. Storing shaped data and de-shaped in a repeating pattern of 28 word lines associated with shaped data and four word lines associated with de-shaped data, de-shaped data may be interspersed with shaped data in the closed memory block 202 according to a periodic pattern. Additional sets of word lines (not illustrated) may store shaped data and de-shaped data according to the same repeating (e.g., periodic) pattern.

In other implementations, shaped data and de-shaped data may be interspersed according to a different periodic pattern. For example, in each group of word lines, de-shaped data may be stored before shaped data, de-shaped data may be stored between sub-groups of word lines that store shaped data, or shaped data may be stored among sub-groups of word lines that store de-shaped data. In still other implementations, the de-shaped data may be stored at particular word lines that do not represent a periodic pattern.

As explained with reference to FIG. 1, a representation of the de-shaped data may be read during a polling cycle of the closed memory block 202 for use in determination of a block health metric for the closed memory block 202. Because the closed memory block 202 stores at least some de-shaped data, the block health metric may be more accurate as compared to a block health metric determined for a memory block of a data storage device that stores only shaped data and no de-shaped data.

Figure 3:
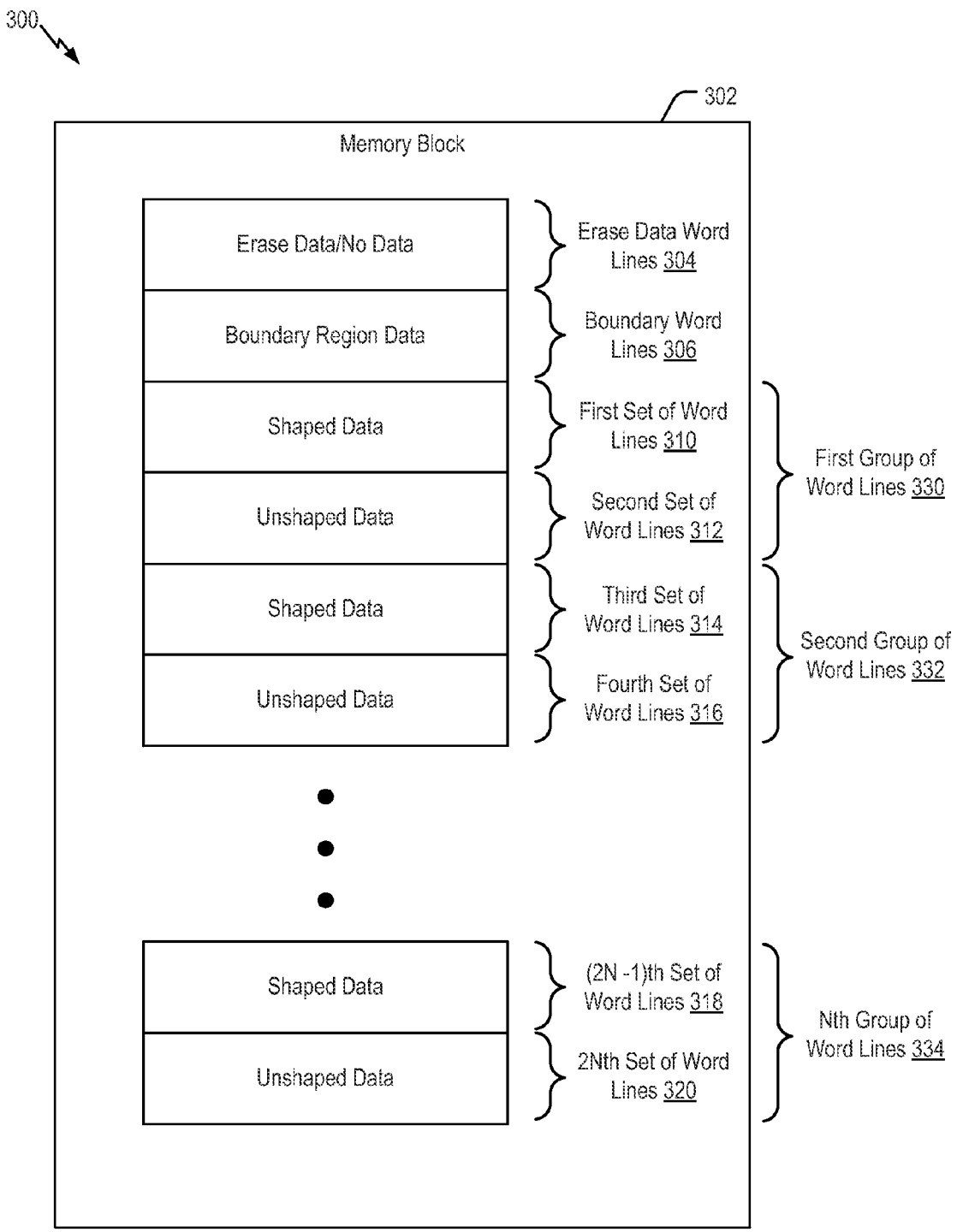
FIG. 3 is a block diagram that illustrates an open block of the memory 104 of FIG. 1 that stores shaped data and de-shaped data.

Referring to FIG. 3, a diagram 300 of an illustrative example of an open memory block 302 of the data storage device 102 of FIG. 1 is illustrated. In some implementations, the open memory block 302 may include or correspond to the first portion 103 of the memory 104 of FIG. 1. FIG. 3 illustrates the open memory block 302 during a polling cycle of the open memory block 302.

The open memory block 302 includes a plurality of word lines. For example, the open memory block 302 may include erase data word lines 304, boundary word lines 306, a first group of word lines 330 that includes a first set of word lines 310 and a second set of word lines 312, a second group of word lines 332 that includes a third set of word lines 314 and a fourth set of word lines 316, and a Nth group of word lines 334 that includes a (2N–1)th set of word lines 318 and a 2Nth set of word lines 320. One or more storage elements may be accessible via each of the word lines and may be configured to store data. For example, the storage elements may store single-level cell (SLC) data, multi-level cell (MLC) data, or other data.

Unlike in FIG. 2, after some P/E cycles, a memory block may not be filled. A memory block that is not closed for programming may be referred to as an open memory block. Even though the block is open, health calculations may still be performed for the open block. After a particular P/E cycle of the memory block 302, the memory block 302 may remain open. Erased storage elements may be accessed via the erase data word lines 304 and storage elements that store data may be accessed via the boundary word lines 306. For example, the storage elements accessible via the erase data word lines 304 may store erase data (e.g., a charge corresponding to an erase state) and the storage elements accessible via the boundary word lines 306 may store data written by the controller. However, the boundary word lines 306 may not be read during a polling cycle, as further described herein. Additionally, the open memory block 302 may store shaped data and de-shaped data. For example, storage elements accessible via the first set of word lines 310, the third set of word lines 314, and the (2N–1)th set of word lines 318 may store shaped data, and storage elements accessible via the second set of word lines 312, the fourth set of word lines 316, and the 2Nth set of word lines 320 may store de-shaped data. In other implementations, storage elements accessible via the second set of word lines 312, the fourth set of word lines 316, and the 2Nth set of word lines 320 may store data that is processed by a data pre-processing operation prior to being processed by one or more data shaping operations, such that the data has the same characteristics as de-shaped data. The second set of word lines 312, the fourth set of word lines 316, and the 2Nth set of word lines 320 may be identified by the de-shaped data location information 162 of FIG. 1. Based on an amount of data written to the open memory block 302, storage elements accessible via one or more word lines identified in the de-shaped data location information 162 may not be programmed during the P/E cycle.

As illustrated in FIG. 3, the open memory block 302 may store de-shaped data that is interspersed with the shaped data in a periodic pattern. As a particular example, each group of word lines may include thirty-two word lines, and the open memory block 302 may include one hundred and twenty-eight word lines, such that N is four in this example. In this example, de-shaped data may be stored at storage elements accessible via sets of four word lines, and shaped data may be stored at storage elements accessible via sets of 28 word lines. For example, the first set of word lines 310, the third set of word lines 314, and the (2N–1)th set of word lines 318 may include 28 word lines, and the second set of word lines 312, the fourth set of word lines 316, and the 2Nth set of word lines 320 may include four word lines. Storing shaped data and de-shaped in a repeating pattern of 28 word lines associated with shaped data and four word lines associated with de-shaped data, de-shaped data may be interspersed with shaped data in the open memory block 302 according to a periodic pattern. Additional sets of word lines (not illustrated) may store shaped data and de-shaped data according to the same repeating (e.g., periodic) pattern. As explained with reference to FIG. 2, in other implementations, shaped data and de-shaped data may be stored according to a different periodic pattern or de-shaped data may be stored in word lines that do not follow a repeating pattern.

As explained with reference to FIG. 1, a representation of the de-shaped data may be read during a polling cycle of the open memory block 302 for use in determination of a block health metric for the open memory block 302. Data is not read from storage elements accessible via the erase data word lines 304 and the boundary word lines 306 for use in computing the block health metric of the open memory block 302. However, reading (e.g., sampling) de-shaped data from an open memory block may cause disturbances in the erase data. If too many disturbances are caused by reading (e.g., sampling) the de-shaped data from an open memory block, the sampling process should be postponed until the memory block is closed. A portion of the erase data stored in storage elements accessible via the erase data word lines 304 may be read (e.g., sampled) during the polling cycle to determine if reading (e.g., sampling) the de-shaped data is causing too many disturbances in the erase data. A number of disturbances associated with the portion may be compared to a threshold, and if the number exceeds the threshold, sampling of de-shaped data for determining a block health metric may be postponed until the memory block is closed. Thus, a block health metric may be determined for an open memory block as long as the process of reading de-shaped data from the open block does not cause too many disturbances to erase data of the open block.

Figure 4:
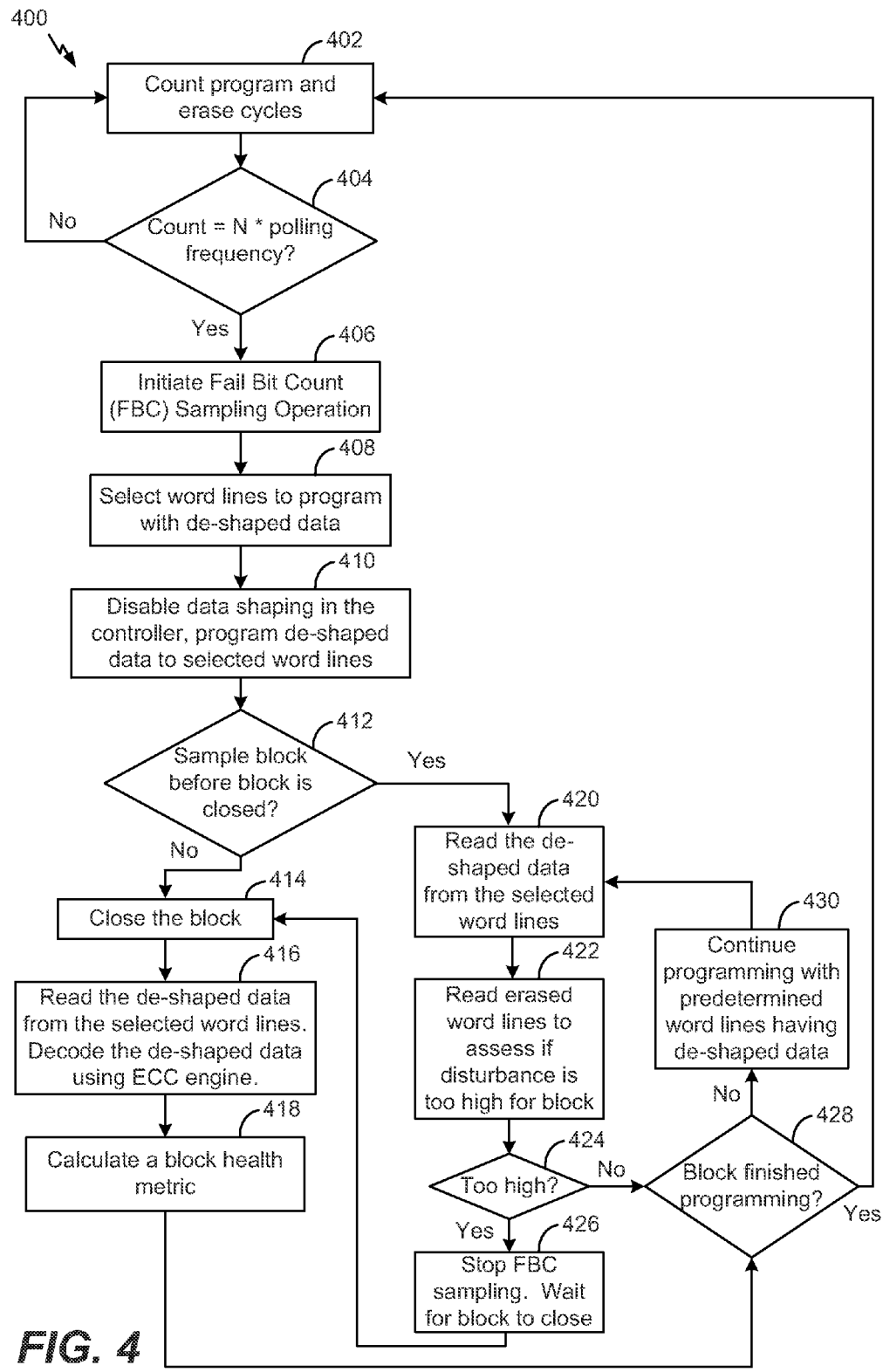
FIG. 4 is a flow diagram that illustrates a particular example of a method of operation of the controller of the data storage device of FIG. 1.

Referring to FIG. 4, a particular illustrative example of a method is depicted and generally designated 400. The method 400 may be performed at the data storage device 102, such as by the memory health monitor 176, the controller 120, the access device 150, or a combination thereof, as illustrative, non-limiting examples.

The method 400 may include counting program and erase (P/E) cycles of a portion (e.g., block) of a memory, at 402. For example, the controller 120 may count P/E cycles for the first portion 103 of the memory 104 using one of the one or more P/E counters 166. The method 400 may include determining whether the count of P/E cycles=N*polling frequency, at 404. For example, if a polling cycle is to occur after each one hundred and twenty-eight P/E cycles, the controller 120 determines whether the count of P/E cycles=N*128. In other implementations, N may be a different number. If the count of P/E cycles is not equal to N*polling frequency, the method 400 returns to 402 to count the P/E cycles.

If the count of P/E cycles equals N*polling frequency, the method 400 continues to 406, where a fail bit count (FBC) sampling operation is initiated. For example, during a polling cycle, the controller 120 initiates a memory health monitoring operation. The memory health monitoring operation may include a FBC sampling operation. The method 400 may include selecting word lines to program with de-shaped data, at 408. For example, the controller may access the de-shaped data location information 162 to determine a group of word lines associated with de-shaped data during a polling cycle of the first portion 103 of the memory 104. The method 400 may include disabling data shaping in the controller and programming de-shaped data to the selected word lines, at 410. For example, the data shaper 172 may be disabled and the controller 120 may write de-shaped data (e.g., the second data 135) to the second set of storage elements 112. In other implementations, the second data 135 may be processed using a data pre-processing operation and one or more data shaping operations such that, after the processing, the second data 135 resembles de-shaped data. Additionally the controller 120 may write shaped data (e.g., the first data 134) to the first set of storage elements 111.

The method 400 may include determining whether to sample the block before the block is closed, at 412. For example, the controller 120 may determine whether to sample the first portion 103 (e.g., the block) based on an amount of data written to the first portion 103 during the last P/E cycle. If the block is to be sampled before being closed, the method 400 continues to 420, where the de-shaped data is read from the selected word lines. For example, the controller 120 may read the representation 136 of the second data 135 from the first portion 103 of the memory 104.

The method 400 may include reading erased word lines to assess if a disturbance caused by the FBC sampling operation is too high, at 422. For example, the controller 120 may read erased data from the erase data word lines 304 of FIG. 3. The method 400 may include determining if the disturbance is too high, at 424. For example, the controller 120 may compare a number of disturbances in the erase data to a threshold. If the number exceeds the threshold, the disturbance is too high. If the disturbance is too high, the method 400 continues to 428, which includes determining whether the block is finished programming. If the block is not finished programming, the method 400 continues to 430, and the block is continued programming with predetermined word lines having de-shaped data. After this additional programming, the method 400 returns to 420, and the de-shaped data is read from the selected word lines. If the block is finished programming, the method 400 returns to 402.

If the disturbance is not too high at 424, the method 400 continues to 426, and the FBC sampling is stopped (e.g., postponed) until the block is closed. The method 400 continues to 414, and the block is closed. For example, the first portion 103 of the memory 104 is closed, as illustrated with reference to the closed memory block 202 of FIG. 2. Additionally or alternatively, if the block is not to be sampled before being closed, at 412, the method continues to 414, and the block is closed.

The method 400 may include reading the de-shaped data from the selected word lines and decoding the de-shaped data using an ECC engine, at 416. For example, the controller 120 may read the representation 136 of the second data 135 (e.g., the de-shaped data) from the first portion 103 of the memory 104. The representation 136 of the second data 135 may be decoded and a bit error rate (e.g., a fail bit count (FBC)) may be calculated by the ECC engine 174. The method 400 may include calculating a block health metric, at 418. For example, the memory health monitor 176 may calculate the block health metric 178 based on the bit error rate and a count of P/E cycles associated with the first portion 103 of the memory 104.

By programming some de-shaped data to a memory prior to a polling cycle, an accuracy of a block health metric determined during the polling cycle may be improved. For example, the data storage device may determine the block health metric based on de-shaped data, which may result in a more accurate block health metric than if the block health metric is determined based on shaped data. The FBC sampling and determination of the block health metric may be performed on closed blocks of the memory. Additionally, the FBC sampling and determination of the block health metric may be performed on open memory blocks if the FBC sampling does not cause too high of a disturbance to erase data.

Figure 5:
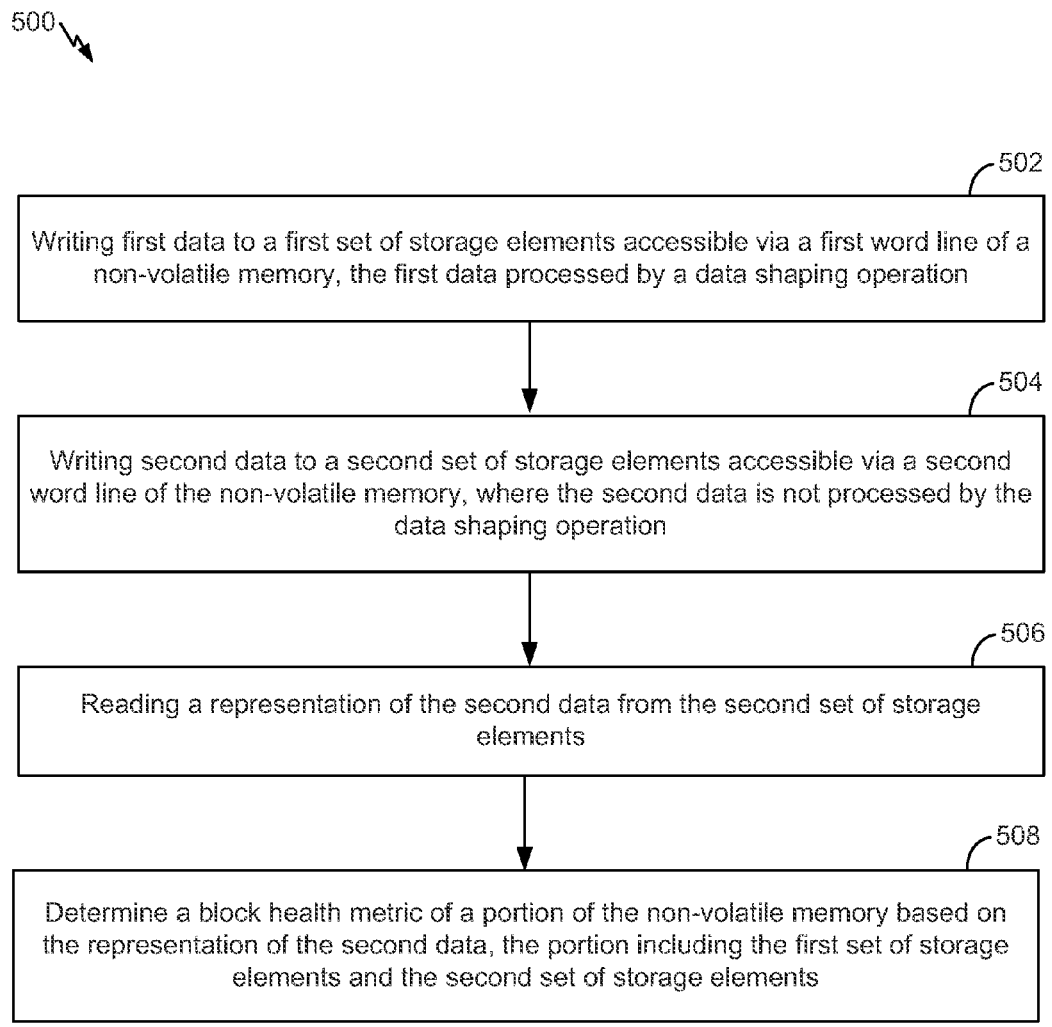
FIG. 5 is a flow diagram that illustrates another particular example of a method of operation of the controller of the data storage device of FIG. 1.

Referring to FIG. 5, a particular illustrative example of a method is depicted and generally designated 500. The method 500 may be performed at the data storage device 102, such as by the memory health monitor 176, the controller 120, the access device 150, or a combination thereof, as illustrative, non-limiting examples.

The method 500 may include writing first data to a first set of storage elements accessible via a first word line of a non-volatile memory, at 502. The first data may be processed by a data shaping operation. For example, the controller 120 may write the first data 134 to the first set of storage elements 111 of the first portion 103 of the memory 104. Prior to writing the first data 134, the first data 134 may be processed by one or more data shaping operations by the data shaper 172 such that the first data 134 is shaped data. The data shaping operation may be configured to generate shaped data having a larger number of bits having a first value than bits having a second value. For example, the one or more data shaping operations of the data shaper 172 may be configured to generate shaped data having a larger number of bits having a first value (e.g., a logical one value) than bits having a second value (e.g., a logical zero value).

The method 500 may include writing second data to a second set of storage elements accessible via a second word line of the non-volatile memory, at 504. The second data may not be processed by the data shaping operation. For example, the controller 120 may write the second data 135 to the second set of storage elements 112 of the first portion 103 of the memory 104. In some implementations, the second data 135 is not processed by the one or more data shaping operations by the data shaper 172 such that the second data 135 is de-shaped data. In other implementations, the second data 135 is processed by a data pre-processing operation prior to being processed by the one or more data shaping operations, such that after processing the second data 135 is de-shaped data. The second data may be written to the second set of storage elements during a P/E cycle prior to a polling cycle of the portion of the non-volatile memory. For example, the second data 135 may be written to the second set of storage elements 112 during a P/E cycle of the first portion 103 of the memory 104 prior to a polling cycle of the first portion 103.

The method 500 may include reading a representation of the second data from the second set of storage elements, at 506. For example, the controller 120 may read the representation 136 of the second data 135 from the second set of storage elements 112. In a particular implementation, the representation of the second data may be read after completion of programming the portion of the non-volatile memory. For example, the representation of de-shaped data may be read from a closed memory block, such as the closed memory block 202 of FIG. 2. Alternatively, the representation of the second data may be read prior to completion of programming the portion of the non-volatile memory. For example, the representation of de-shaped data may be read from an open memory block, such as the open memory block 302 of FIG. 3.

The method 500 may further include determining a block health metric of a portion of the non-volatile memory based on the representation of the second data, at 508. The portion may include the first set of storage elements and the second set of storage elements. For example, the memory health monitor 176 of the controller 120 may determine the block health metric 178 associated with the first portion 103 of the memory 104 based on the representation 136 of the second data 135. In a particular implementation, the block health metric may be determined based on a bit error rate of the representation of the second data and based on a count of P/E cycles of the portion of the non-volatile memory. For example, the memory health monitor 176 may determine the block health metric 178 based on a bit error rate determined by the ECC engine 174 and based on a count of P/E cycles indicated by one of the one or more P/E counters 166. Additionally, the method 500 may include performing a normalization operation on the bit error rate prior to determining the block health metric. The normalization operation may be based on a shaping level associated with the data shaping operation. For example, in implementations where the second data 135 is processed by the data pre-processing operation and the one or more data shaping operations, the controller 120 may perform a normalization operation on a bit error rate based on a data shaping level prior to determining the block health metric 178.

In a particular implementation, the method 500 includes maintaining a count of P/E cycles corresponding to the portion of the non-volatile memory. The second data may be written to the second set of storage elements during a P/E cycle when the count has a value that is a multiple of a particular count value associated with a block health update. For example, the controller 120 may maintain the one or more P/E counters 166, and the second data 135 may be written to the second set of storage elements 112 when a count of P/E cycles associated with the first portion 103 of the memory 104 is a multiple of a particular count value (e.g., a number of P/E cycles between polling cycles). Additionally, the method 500 may include writing third data to the first set of storage elements and writing fourth data to the second set of storage elements. The third data may be processed by the data shaping operation, the fourth data may be processed by the data shaping operation, and the third data and the fourth data may be written during a P/E cycle when the count has a value that is not a multiple of the particular value. For example, during P/E cycles that are not multiple of the particular value, shaped data may be written to the first set of storage elements 111 and to the second set of storage elements 112.

In a particular implementation, the controller may be configured to store a table that identifies a group of word lines associated with data that is not shaped by the shaping operation. The group of word lines may include the second word line. For example, the controller 120 may store the de-shaped data location information 162 that identifies one or more groups of word lines that are to store de-shaped data during polling cycles of corresponding portions of the memory 104. In some implementations, the de-shaped data location information 162 may be a table that identifies a group of word lines. Additionally, the method 500 may include writing data that is not processed by the data shaping operation to storage elements accessible via the group of word lines prior to a first polling cycle. The method 500 may also include writing data that is not processed by the data shaping operation to storage elements accessible via a second group of word lines prior to a second polling cycle. The table may further identify the second group of word lines. For example, the de-shaped data location information 162 may identify multiple groups of word lines associated with different polling cycles. De-shaped data may be written to storage elements accessible via a first group of word lines (e.g., the second set of storage elements 112) prior to a first polling cycle, and de-shaped data may be written to storage elements accessible via a second group of word lines prior to a second polling cycle. Additionally, the method 500 may further include writing data that is not processed by the data shaping operation to each of one or more sets of storage elements of the portion of the non-volatile memory during a polling cycle of the portion of the non-volatile memory. The one or more sets of storage elements may correspond to the group of word lines. For example, the second set of storage elements 112 may be identified by the de-shaped data location information 162, and the second data 135 may be written to the second set of storage elements 112 during a polling cycle of the first portion 103 of the memory 104.

In a particular implementation, the method 500 includes writing third data to the first set of storage elements, the third data processed by the data shaping operation and writing fourth data to the second set of storage elements. The fourth data may be processed by a data preprocessing operation prior to being processed by the data shaping operation. For example, the controller 120 may process fourth data with a data pre-processing operation prior to processing both third data and the fourth data with the one or more data shaping operations. Due to the data pre-processing operation, the fourth data may be de-shaped data after being processed by the one or more data shaping operations. In this implementation, the method 500 further includes reading a representation of the fourth data from the second set of storage elements and determining a second block health metric of the portion of the non-volatile memory during a second polling cycle based on the representation of the fourth data. For example, the controller 120 may read a representation of the fourth data from the first portion 103 of the memory 104 and the memory health monitor 176 may determine a block health metric based on the representation of the fourth data.

In a particular implementation, a data storage device includes a non-volatile memory and a controller coupled to the non-volatile memory. The controller is configured to write first data to a first set of storage elements accessible via a first word line of the non-volatile memory and to write second data to a second set of storage elements accessible via a second word line of the non-volatile memory. The first data may be processed by a data shaping operation, and the second data may not be processed by the data shaping operation. The controller is further configured to read a representation of the second data from the second set of storage elements and determine a block health metric of a portion of the non-volatile memory based on the representation of the second data. The portion may include the first set of storage elements and the second set of storage elements. For example, the data storage device 102 includes the memory 104 (e.g., a non-volatile memory) and the controller 120, configured to perform the steps of the method 500.

By writing some de-shaped data to a memory prior to a polling cycle, an accuracy of a block health metric determined during the polling cycle may be improved. For example, the data storage device may determine the block health metric based on de-shaped data, which may result in a more accurate block health metric than if the block health metric is determined based on shaped data. Because de-shaped data is written to a portion of a memory block (and not to an entirety of the memory block), and the de-shaped data is written during particular P/E cycles (and not during each P/E cycle), shaped data may be written to the rest of the memory block during the particular P/E cycles and to an entirety of the memory block during other P/E cycles, thereby reducing wear to the memory block.

The method 400 of FIG. 4 and/or the method 500 of FIG. 5 may be initiated or controlled by an application-specific integrated circuit (ASIC), a processing unit, such as a central processing unit (CPU), a controller, another hardware device, a firmware device, a field-programmable gate array (FPGA) device, or any combination thereof. As an example, method 400 of FIG. 4 and/or the method 500 of FIG. 5 can be initiated or controlled by one or more processors, such as one or more processors included in or coupled to a controller or a memory of the data storage device 102 and/or the access device 150 of FIG. 1. A controller configured to perform the method 400 of FIG. 4 and/or the method 500 of FIG. 5 may be able to select between a first scheduling scheme and a second scheduling scheme to schedule operations for a storage device. As an example, one or more of the methods of FIGS. 4 and 5, individually or in combination, may be performed by the controller 120 of FIG. 1. To illustrate, a portion of one of the methods FIGS. 4 and 5 may be combined with a second portion of one of the methods of FIGS. 4 and 5. Additionally, one or more operations described with reference to the FIGS. 4 and 5 may be optional, may be performed at least partially concurrently, and/or may be performed in a different order than shown or described.

In an illustrative example, a processor may be programmed to program a set of storage elements with de-shaped data during a particular program and erase cycle such that a more accurate block health metric may be determined. For example, the processor may execute instructions to write first data to a first set of storage elements accessible via a first word line of a non-volatile memory. The first data may be processed by a data shaping operation. The processor may further execute instructions to write second data to a second set of storage elements accessible via a second word line of the non-volatile memory. The second data may not be processed by the data shaping operation. The processor may further execute instructions to read a representation of the second data from the second set of storage elements. The processor may further execute instructions determine a block health metric of a portion of the non-volatile memory based on the representation of the second data. The portion including the first set of storage elements and the second set of storage elements.

Although various components of the data storage device 102 and/or the access device 150 of FIG. 1 are depicted herein as block components and described in general terms, such components may include one or more microprocessors, state machines, or other circuits configured to enable the various components to perform operations described herein. One or more aspects of the various components may be implemented using a microprocessor or microcontroller programmed to perform operations described herein, such as one or more operations of the method 400 of FIG. 4 and/or the method 500 of FIG. 5. In a particular implementation, each of the controller 120, the memory 104, the second memory 160, and/or the access device 150 of FIG. 1 includes a processor executing instructions that are stored at a memory, such as a non-volatile memory of the data storage device 102 or the access device 150 of FIG. 1. Alternatively or additionally, executable instructions that are executed by the processor may be stored at a separate memory location that is not part of the non-volatile memory, such as at a read-only memory (ROM) of the data storage device 102 or the access device 150 of FIG. 1.

With reference to FIG. 1, the data storage device 102 may be attached to or embedded within one or more access devices, such as within a housing of a communication device (e.g., the access device 150). For example, the data storage device 102 may be integrated within an apparatus, such as a mobile telephone, a computer (e.g., a laptop, a tablet, or a notebook computer), a music player, a video player, a gaming device or console, an electronic book reader, a personal digital assistant (PDA), a portable navigation device, or other device that uses non-volatile memory. However, in other embodiments, the data storage device 102 may be implemented in a portable device configured to be selectively coupled to one or more external access devices. In still other embodiments, the data storage device 102 may be a component (e.g., a solid-state drive (SSD)) of a network accessible data storage system, such as an enterprise data system, a network-attached storage system, a cloud data storage system, etc.

To further illustrate, the data storage device 102 may be configured to be coupled to the access device 150 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof. In yet another particular implementation, the data storage device 102 is coupled to the access device 150 indirectly, e.g., via a network. For example, the data storage device 102 may be a network-attached storage (NAS) device or a component (e.g., a solid-state drive (SSD) device) of a data center storage system, an enterprise storage system, or a storage area network.

The memory 104 and/or the second memory 160 of FIG. 1 may include a resistive random access memory (ReRAM), a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively, or in addition, the memory 104 and/or the second memory 160 may include another type of memory. The memory 104 and/or the second memory 160 of FIG. 1 may include a semiconductor memory device.

Semiconductor memory devices include volatile memory devices, such as dynamic random access memory ("DRAM") or static random access memory ("SRAM") devices, non-volatile memory devices, such as magnetoresistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
a non-volatile memory; and
a controller coupled to the non-volatile memory, the controller configured to:
write first data to a first set of storage elements accessible via a first word line of the non-volatile memory, the first data processed by a data shaping operation;
write second data to a second set of storage elements accessible via a second word line of the non-volatile memory, wherein the second data is not processed by the data shaping operation;
read a representation of the second data from the second set of storage elements; and
determine a block health metric of a portion of the non-volatile memory based on the representation of the second data, the portion including the first set of storage elements and the second set of storage elements, wherein the data shaping operation is configured to generate shaped data having a larger number of bits having a first value than bits having a second value.

2. The data storage device of claim 1, wherein the block health metric is determined based on a bit error rate of the representation of the second data and based on a count of program and erase cycles corresponding to the portion of the non-volatile memory.

3. The data storage device of claim 1, wherein the block health metric is determined based on a comparison of the bit error rate of the representation of the second data to one or more bit error rate thresholds.

4. The data storage device of claim 1, wherein the controller is configured to store a table that identifies a group of word lines associated with data that is not shaped by the shaping operation, and wherein the group of word lines includes the second word line.

5. The data storage device of claim 4, wherein the table further identifies a second group of word lines that is associated with data that is not shaped by the data shaping operation, wherein the controller is further configured to write data that is not shaped to storage elements accessible via the group of word lines prior to a first polling cycle, and wherein the controller is further configured to write data that is not shaped to storage elements accessible via the second group of word lines prior to a second polling cycle.

6. The data storage device of claim 4, wherein the non-volatile memory is divided into multiple portions, and wherein each of the multiple portions is associated with a corresponding entry in the table.

7. The data storage device of claim 6, wherein the multiple portions include multiple blocks of the non-volatile memory.

8. The data storage device of claim 4, wherein the controller is further configured to write data that is not processed by the data shaping operation to each of one or more sets of storage elements of the portion of the non-volatile memory during a polling cycle of the portion of the non-volatile memory, and wherein the one or more sets of storage elements are selected based on the group of word lines.

9. A method comprising:
writing first data to a first set of storage elements accessible via a first word line of a non-volatile memory, the first data processed by a data shaping operation;
writing second data to a second set of storage elements accessible via a second word line of the non-volatile memory, wherein the second data is not processed by the data shaping operation;
reading a representation of the second data from the second set of storage elements; and
determining a block health metric of a portion of the non-volatile memory based on the representation of the second data, the portion including the first set of storage elements and the second set of storage elements, wherein the data shaping operation is configured to generate shaped data having a larger number of bits having a first value than bits having a second value.

10. The method of claim 9, wherein the second data is written to the second set of storage elements during a program and erase cycle prior to a polling cycle of the portion of the non-volatile memory.

11. The method of claim 9, further comprising maintaining a count of program and erase cycles corresponding to the portion of the non-volatile memory, and wherein the second data is written to the second set of storage elements during a program and erase cycle when the count has a value that is a multiple of a particular count value.

12. The method of claim 11, further comprising:
writing third data to the first set of storage elements, the third data processed by the data shaping operation; and
writing fourth data to the second set of storage elements, the fourth data processed by the data shaping operation, wherein the third data and the fourth data are written during a program and erase cycle when the count has a value that is not a multiple of the particular count value.

13. The method of claim 9, further comprising:
writing data that is not processed by the data shaping operation to storage elements accessible via a particular group of word lines prior to a first polling cycle; and
writing data that is not processed by the data shaping operation to storage elements accessible via a second group of word lines prior to a second polling cycle.

14. The method of claim 9, further comprising:
writing third data to the first set of storage elements, the third data processed by the data shaping operation;
writing fourth data to the second set of storage elements, wherein the fourth data is process ed by a data preprocessing operation prior to being processed by the data shaping operation;
reading a representation of the fourth data from the second set of storage elements; and
determining a second block health metric of the portion of the non-volatile memory during a second polling cycle based on the representation of the fourth data.

15. A data storage device comprising:
a controller, wherein the controller determines a block health metric of a portion of the non-volatile memory based on the representation of the second data, the portion including the first set of storage elements and the second set of storage elements; and
a non-volatile memory coupled to the controller and including storage elements configured to store data, wherein the storage elements are organized into multiple portions, and wherein at least one of the multiple portions stores de-shaped data and shaped data, wherein the shaped data having a larger number of bits having a first value than bits having a second value.

16. The data storage device of claim 15, wherein the de-shaped data is interspersed with the shaped data within the at least one of the multiple portions according to a periodic pattern.

17. The data storage device of claim 16, wherein the non-volatile memory is further configured to store a table identifying a set of word lines, and wherein the periodic pattern is based on the set of word lines.

18. The data storage device of claim 15, wherein the multiple portions include multiple blocks, wherein the at least one portion includes a first block of the non-volatile memory, and wherein the at least one portion further includes erased storage elements.

19. The data storage device of claim 15, wherein the controller is configured to read a representation of the de-shaped data from the at least one portion, and wherein the controller is further configured to determine a block health metric of the at least one portion based on the representation of the de-shaped data.

* * * * *